(12) United States Patent
Kawano

(10) Patent No.: US 7,276,967 B2
(45) Date of Patent: Oct. 2, 2007

(54) SIGNAL LEVEL ADJUSTING APPARATUS, GAIN VALUE UPDATING METHOD, AND PROGRAM

(75) Inventor: Seiji Kawano, Sunnyvale, CA (US)

(73) Assignee: Sanyo Electric Co., Ltd., Osaka (JP)

(*) Notice: Subject to any disclaimer, the term of this patent is extended or adjusted under 35 U.S.C. 154(b) by 175 days.

(21) Appl. No.: 11/173,487

(22) Filed: Jul. 1, 2005

(65) Prior Publication Data

US 2007/0001759 A1 Jan. 4, 2007

(51) Int. Cl.
*H03G 3/20* (2006.01)
(52) U.S. Cl. .................................. 330/136; 330/279
(58) Field of Classification Search .................. 330/136
See application file for complete search history.

(56) References Cited

U.S. PATENT DOCUMENTS 6,433,633 B1 * 8/2002 Hellum ....................... 330/136
6,597,898 B1 * 7/2003 Iwata et al. ............... 455/240.1

FOREIGN PATENT DOCUMENTS

JP          2003-046353         2/2003

\* cited by examiner

*Primary Examiner*—Robert Pascal
*Assistant Examiner*—Alan Wong
(74) *Attorney, Agent, or Firm*—SoCal IP Law Group LLP; Steven C. Serboff; John E. Gunther

(57) ABSTRACT

A signal level adjusting apparatus comprises an amplifier that amplifies an input signal with a gain of a first gain value and outputs an amplified signal; a gain calculator that obtains a second gain value according to a signal level of the input signal; and a gain updater that updates the first gain value stepwise such that the first gain value approaches the second gain value by steps corresponding to an error between the first gain value and the second gain value.

17 Claims, 6 Drawing Sheets

SIGNAL LEVEL ADJUSTING APPARATUS, GAIN VALUE UPDATING METHOD, AND PROGRAM

BACKGROUND OF THE INVENTION

1. Field of the Invention

The present invention relates to a signal level adjusting apparatus, a gain value updating method, and a program.

2. Description of the Related Art

In the playback process for music, it is usual that the input signal is amplified with a gain of a gain value according to the level of the signal and the amplified signal is outputted. For example, in MP3 (MPEG Audio Layer-3) players, when consecutively playing back MP3 files of different audio recording levels, dynamic range control, auto-gain control, and the like are performed in order that sound volume does not change much when switching the files. See, for example, Japanese Patent Application Laid-Open Publication No. 2003-46353.

As such, in a signal level adjusting apparatus that adjusts a signal level and outputs a signal, the gain value is updated according to the signal level of the input signal, but if the gain value is rapidly changed, playback sound volume will rapidly change or noise will occur. Hence, the gain value is updated such that the gain value approaches a target gain value stepwise.

FIG. 11 is a flow chart illustrating an example of a conventional procedure with which the gain value is updated by steps corresponding to a predetermined value. First, the signal level of the input signal ($x_i$) is detected (S1101). Then, a gain value $g_t$ corresponding to the signal level is obtained (S1102). Note that the function f is a predefined function for obtaining the signal level of an output signal from the signal level of the input signal.

Then, if a current gain value $g_a$ is greater than the target gain value $g_t$ (S1103: YES), by multiplying the $g_a$ by a predetermined value $\alpha_-$ ($\alpha_-<1$) or subtracting $\alpha_-$ from $g_a$, the $g_a$ is decreased by steps corresponding to $\alpha_-$ (S1104). On the other hand, if a current gain value $g_a$ is smaller than the target gain value $g_t$ (S1105: YES), by multiplying the $g_a$ by a predetermined value $\alpha_+$ ($\alpha_+>1$) or adding $\alpha_+$ to $g_a$, the $g_a$ is increased by steps corresponding to $\alpha_+$ (S1106). Then, the input signal is amplified with a gain of the updated value $g_a$ and outputted (S1107).

By updating the gain value $g_a$ by steps corresponding to predetermined values ($\alpha_+$, $\alpha_-$) as above, the gain value $g_a$ approaches the target gain value $g_t$.

Here, because the $g_a$ is increased or decreased by a step corresponding to the predetermined value, by increasing the step size, the speed at which the $g_a$ converges on the $g_t$ can be increased. As shown in FIG. 12, however, if the step size is large, the $g_a$ oscillates without converging on the $g_t$ when the difference between the $g_a$ and the $g_t$ becomes small. If the gain value $g_a$ oscillates, the problem occurs that output sound oscillates or vibrates. On the other hand, by decreasing the step size, the $g_a$ can be prevented from oscillating, but the speed at which the $g_a$ converges on the $g_t$ becomes slow, and it takes a long time before starting to adjust the signal level with a gain of the gain value according to the signal level of the input signal.

SUMMARY OF THE INVENTION

The present invention was made in view of the above problem, and an object thereof is to provide a signal level adjusting apparatus that updates the gain value stepwise such that the gain value approaches a target gain value at high speed without oscillating.

To achieve the above object, a signal level adjusting apparatus of the present invention comprises an amplifier that amplifies an input signal with a gain of a first gain value and outputs an amplified signal; a gain calculator that obtains a second gain value according to a signal level of the input signal; and a gain updater that updates the first gain value stepwise such that the first gain value approaches the second gain value by steps corresponding to an error between the first gain value and the second gain value.

Furthermore, a signal level adjusting apparatus of the present invention comprises an amplifier that amplifies an input signal with a gain of a first gain value and outputs an amplified signal; a gain calculator that obtains a second gain value according to a signal level of the input signal; and a gain updater that, when an error between the first gain value and the second gain value is greater than a predetermined threshold value, updates the first gain value stepwise such that the first gain value approaches the second gain value by steps corresponding to a predetermined value and, when the error is less than the threshold value, updates the first gain value stepwise such that the first gain value approaches the second gain value by steps corresponding to the error.

Yet further, a signal level adjusting apparatus of the present invention comprises an amplifier that amplifies an input signal with a gain of a first gain value and outputs an amplified signal; a gain calculator that obtains a second gain value according to a signal level of the input signal; and a gain updater that, when an error between the first gain value and the second gain value is greater than a predetermined threshold value, updates the first gain value stepwise such that the first gain value approaches the second gain value by steps corresponding to a predetermined value and to the error and, when the error is less than the threshold value, updates the first gain value stepwise such that the first gain value approaches the second gain value by steps corresponding to the error.

The gain updater may obtain the threshold value based on the second gain value.

Also, the gain updater may obtain the steps corresponding to the error by using a least-squares method so that the error approaches a zero.

The apparatus can update the gain value stepwise such that the gain value approaches a target gain value at high speed without oscillating.

Features and objects of the present invention other than the above will become clear by reading the description of the present specification with reference to the accompanying drawings.

BRIEF DESCRIPTION OF THE DRAWINGS

For a more complete understanding of the present invention and the advantages thereof, reference is now made to the following description taken in conjunction with the accompanying drawings wherein.

DETAILED DESCRIPTION OF THE INVENTION

At least the following matters will be made clear by the explanation in the present specification and the description of the accompanying drawings.

=Configuration of a Signal Level Adjusting Apparatus=

Figure 1:
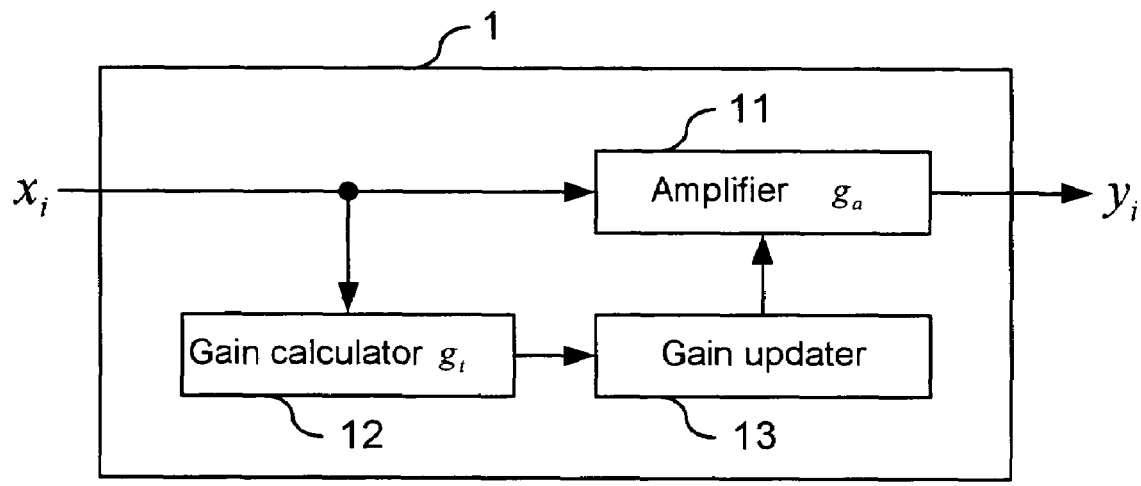
FIG. 1 is a block diagram of a signal level adjusting apparatus according to an embodiment of the present invention.

FIG. 1 is a block diagram of a signal level adjusting apparatus according to an embodiment of the present invention. A signal level adjusting apparatus 1 is an apparatus that changes the signal level of a digital signal inputted and outputs the level-changed signal, and comprises an amplifier 11, a gain calculator 12, and a gain updater 13. Note that each section 11 to 13 can be implemented by, for example, a processor such as DSP (Digital Signal Processor) executing a program stored in a ROM (Read Only Memory).

The amplifier 11 amplifies the signal level of the input signal to the gain value $g_a$ (a first gain value) times that level and outputs an amplified signal. The gain calculator 12 calculates the gain value $g_t$ (a second gain value) corresponding to the signal level of the input signal. The gain updater 13 updates the gain value $g_a$ stepwise such that the gain value $g_a$ approaches a target gain value $g_t$.

Figure 2:
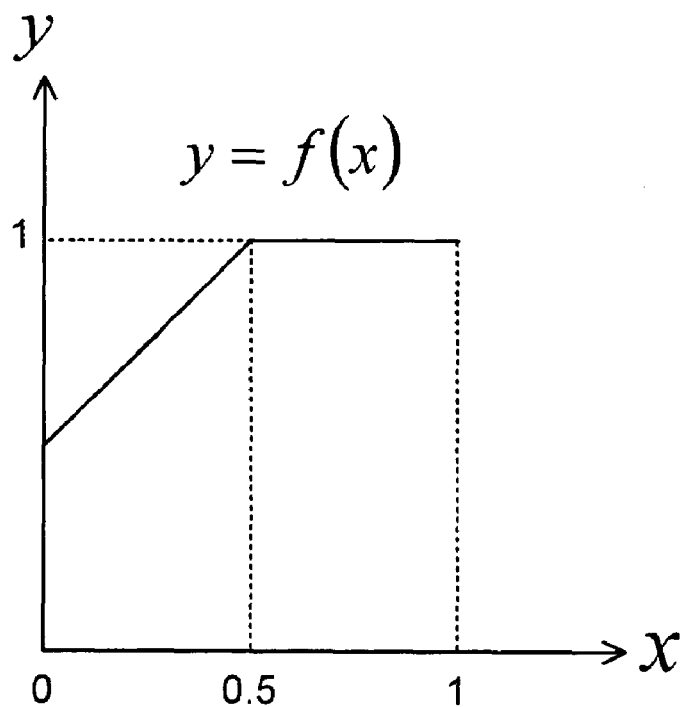
FIG. 2 is a diagram illustrating an example of a relationship between the signal levels of an input signal and of an output signal.

FIG. 2 is a diagram illustrating an example of a relationship between the signal levels of the input signal and of the output signal. Here, the function f is a predefined function representing the relationship between the signal levels of the input signal and of the output signal.

For example, when the signal level of the input signal is at 0.5, the signal level of the output signal f(0.5) equals 1.0. Hence, the $g_t$=f(0.5)/0.5=2, and thus the signal level of the input signal is required to be amplified to twice that level in order to output the inputted signal adjusted in level according to the characteristic of the function f. Accordingly, the gain updater 13 updates the gain value $g_a$ of the amplifier 11 such that the gain value $g_a$ approaches the gain value $g_t$.

=Process of Updating the Gain Value (Part 1)=

Figure 3:
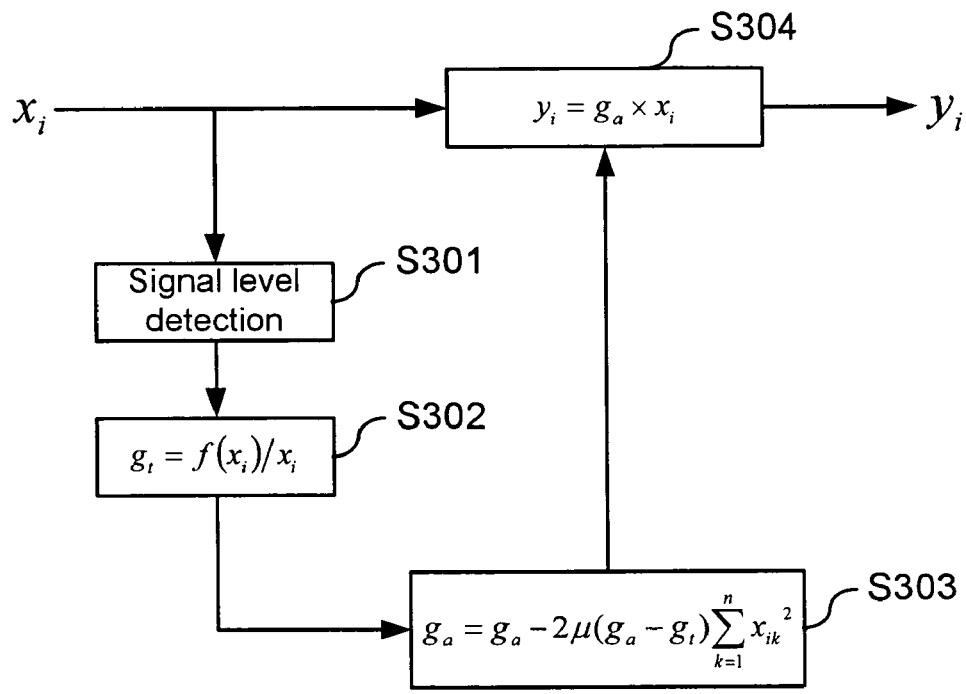
FIG. 3 is a flow chart illustrating an example of the process of updating a gain value $g_a$ by steps according to an error between the gain value $g_a$ and a gain value $g_t$.

Next, a process of updating the gain value $g_a$ by the signal level adjusting apparatus 1 will be described in detail. FIG. 3 is a flow chart illustrating an example of the process of updating the gain value $g_a$ by steps corresponding to the error between the gain value $g_a$ and the gain value $g_t$.

First, the gain calculator 12 detects the signal level $x_i$ of the input signal (S301). Note that in the present invention the method of detecting the signal level $x_i$ can be any one of various methods such as calculating based on an average over a predetermined period of time. Then, the gain calculator 12 obtains the gain value $g_t$ according to the signal level $x_i$ of the input signal by using the equation (1) (S302):

$$g_t = \frac{f(x_i)}{x_i} \tag{1}$$

Next, the gain updater 13 updates the gain value $g_a$ such that the error between the gain value $g_a$ and the gain value $g_t$ approaches a zero (S303), by using a least-squares method expressed by the equation (2):

$$g_a = g_a - 2\mu(g_a - g_t)\sum_{k=1}^{n} x_{ik}^2 \tag{2}$$

Here, μ is a parameter for determining the step by which to update the $g_a$; n is the number of channels; and $x_{ik}$ is the signal level of the k'th channel, which in the case of, for example, a two channel stereo signal, includes $x_{i1}$ (e.g., a left side signal) and $x_{i2}$ (e.g., a right side signal). Note that the $x_i$ in the equation (1) may be any of the $x_{ik}$, or a value obtained based on a plurality of $x_{ik}$.

Then, the amplifier 11 amplifies the input signal with a gain of the updated gain value $g_a$ and outputs an amplified signal (S304).

As such, by updating the gain value $g_a$ by steps corresponding to the error between the gain value $g_a$ and the gain value $g_t$ such that the gain value $g_a$ approaches the gain value $g_t$, the error between the gain value $g_a$ and the gain value $g_t$ can be made to approach a zero.

Figure 4:
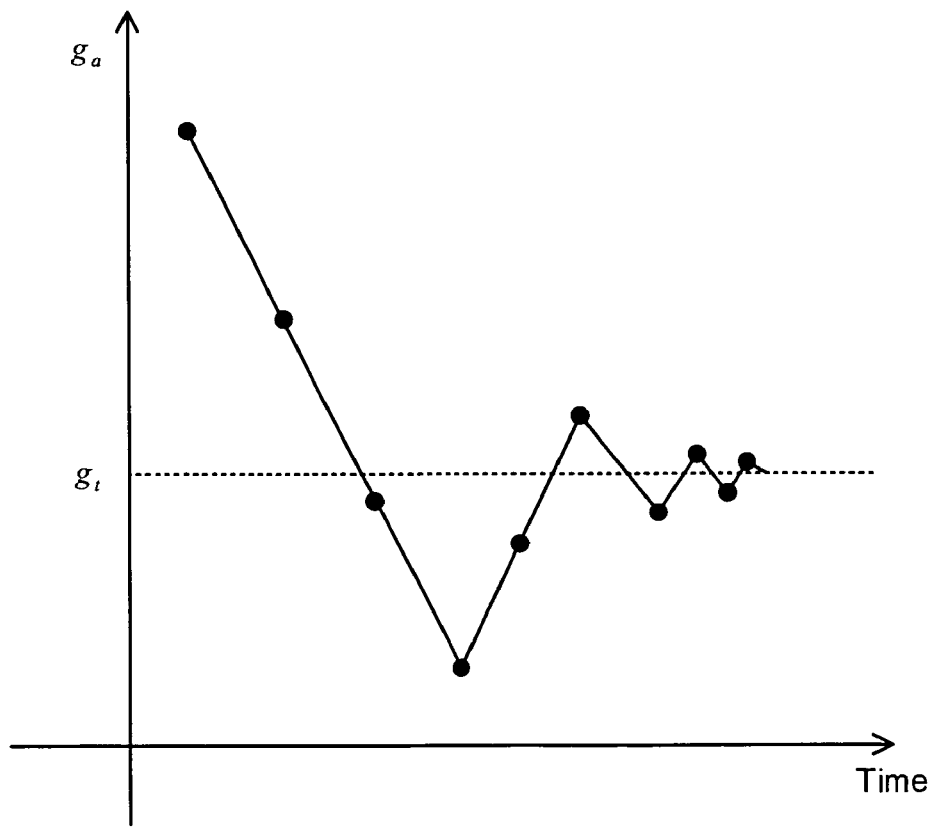
FIG. 4 is a graph showing an example of the transition of the gain value $g_a$ when the gain value $g_a$ is updated by the process of FIG. 3.

FIG. 4 is a graph showing an example of the transition of the gain value $g_a$ when the gain value $g_a$ is updated by the process of FIG. 3. When updating the gain value $g_a$ by using the least-squares method, as shown in the equation (2), the step by which to update the gain value $g_a$ is large during the time that the error between the gain value $g_a$ and the gain value $g_t$ is large, and thereby the speed at which the gain value $g_a$ approaches the gain value $g_t$ becomes fast. Then, as the error becomes smaller, the step by which to update becomes smaller and thus the error between the gain value $g_a$ and the gain value $g_t$ converges on a zero. Therefore, by updating the gain value $g_a$ by using the least-squares method, the gain value $g_a$ can be made to approach the target gain value $g_t$ at high speed without oscillating.

=Process of Updating the Gain Value (Part 2)=

Figure 5:
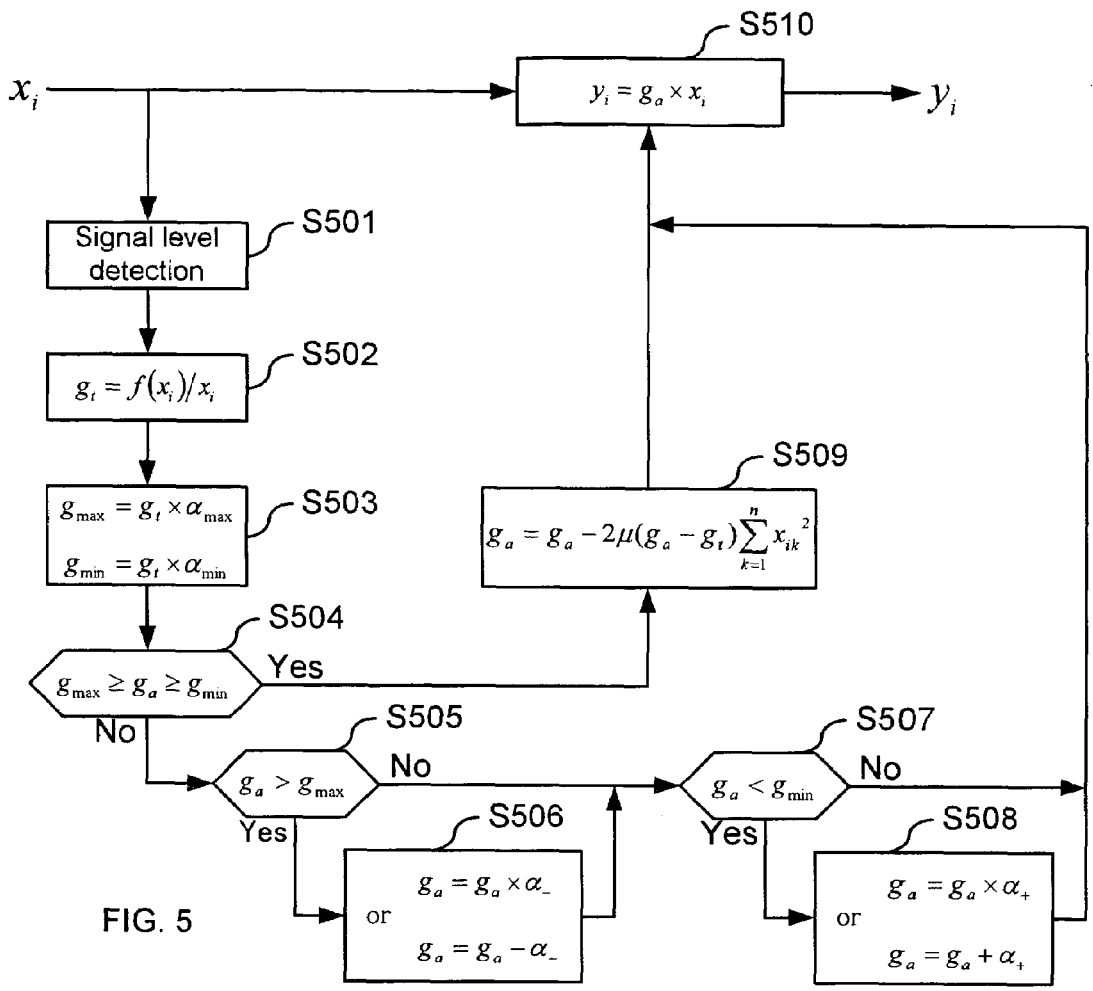
FIG. 5 is a flow chart illustrating an example of the process of updating the gain value $g_a$ by steps corresponding to the error between the gain value $g_a$ and the gain value $g_t$ or to a predetermined value.

FIG. 5 is a flow chart illustrating an example of the process of updating the gain value $g_a$ by steps corresponding to the error between the gain value $g_a$ and the gain value $g_t$ or to a predetermined value.

First, as in the process of FIG. 3, the gain calculator 12 detects the signal level of the input signal and obtains the gain value $g_t$ according to the signal level of the input signal (S501, S502).

Then, the gain updater 13 obtains a gain value $g_{max}$ greater than the gain value $g_t$, and a gain value $g_{min}$ smaller than the gain value $g_t$ (S503). Note that in the present embodiment, the $g_{max}$ is obtained by multiplying the gain value $g_t$ by a predetermined value $\alpha_{max}$ (>1) and the $g_{min}$ is obtained by multiplying the gain value $g_t$ by a predetermined value $\alpha_{min}$ (<1), although the method of obtaining the $g_{max}$ and $g_{min}$ is not limited to this. For example, they may be obtained by adding and subtracting a predetermined value to and from the gain value $g_t$, or by using a predetermined function of the gain value $g_t$ as a variable.

Subsequently, the gain updater 13 confirms whether the gain value $g_a$ is no greater than the $g_{max}$ and no less than the $g_{min}$ (S504).

If the gain value $g_a$ is greater than the $g_{max}$ or less than the $g_{min}$ (S504: NO), the gain updater 13 further confirms whether the gain value $g_a$ is greater than the $g_{max}$ (S505). If the gain value $g_a$ is greater than the $g_{max}$ (S505: YES), the gain updater 13 decreases the $g_a$ by a step corresponding to $\alpha_-$ by multiplying the gain value $g_a$ by a predetermined value $\alpha_-$ ($\alpha_-<1$) or subtracting $\alpha_-$ from $g_a$ (S506). Also, the gain updater 13 confirms whether the gain value $g_a$ is less than the $g_{min}$ (S507). If the gain value $g_a$ is less than the $g_{min}$ (S507: YES), the gain updater 13 increases the $g_a$ by a step corresponding to $\alpha_+$ by multiplying the gain value $g_a$ by a predetermined value $\alpha+$ ($\alpha_+>1$) or adding $\alpha_+$ to $g_a$ (S508).

If the gain value $g_a$ is less than the $g_{max}$ and greater than the $g_{min}$ (S504: YES), the gain updater 13 updates the gain value $g_a$ according to the previous equation (2) (S509).

Then, the amplifier 11 amplifies the input signal with a gain of the updated gain value $g_a$ and outputs an amplified signal (S510).

That is, when the error between the gain value $g_a$ and the gain value $g_t$ is greater than a threshold value ($g_{max}-g_t$, or $g_t-g_{min}$), the gain value $g_a$ is updated stepwise so as to approach the gain value $g_t$ by steps corresponding to the predetermined values ($\alpha_+$, $\alpha_-$), and when the error between the gain value $g_a$ and the gain value $g_t$ is less than the threshold value, the gain value $g_a$ is updated stepwise so as to approach the gain value $g_t$ by steps corresponding to the error, by using the least-squares method.

Figure 6:
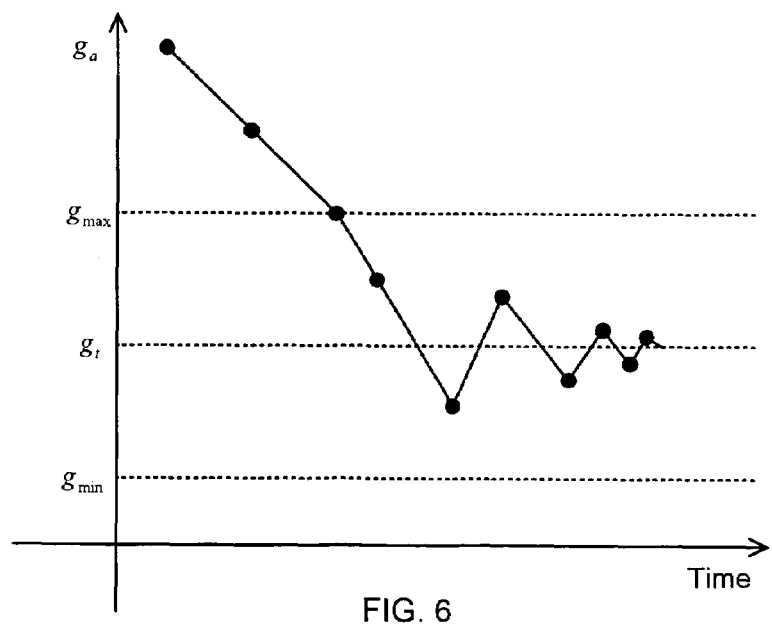
FIG. 6 is a graph showing an example of the transition of the gain value $g_a$ when the gain value $g_a$ is updated by the process of FIG. 5.

FIG. 6 is a graph showing an example of the transition of the gain value $g_a$ when the gain value $g_a$ is updated by the process of FIG. 5. As shown in the Figure, the gain value $g_a$ is updated so as to approach the $g_t$ by steps corresponding to the predetermined values during the time that the gain value $g_a$ is outside the range of from $g_{max}$ to $g_{min}$. In contrast, during the time that the gain value $g_a$ is within the range of from $g_{max}$ to $g_{min}$, the gain value $g_a$ is updated so as to approach the gain value $g_t$ by steps corresponding to the error, by using the least-squares method.

Therefore, when the gain value $g_a$ is outside the range of from $g_{max}$ to $g_{min}$, the speed for until the error between the gain value $g_a$ and the gain value $g_t$ becomes small to a certain degree can be made faster by setting the steps corresponding to the predetermined values to be large. Thereafter, the gain value $g_a$ is updated by using the least-squares method, and hence can be made to approach the gain value $g_t$ without oscillating.

=Process of Updating the Gain Value (Part 3)=

Figure 7:
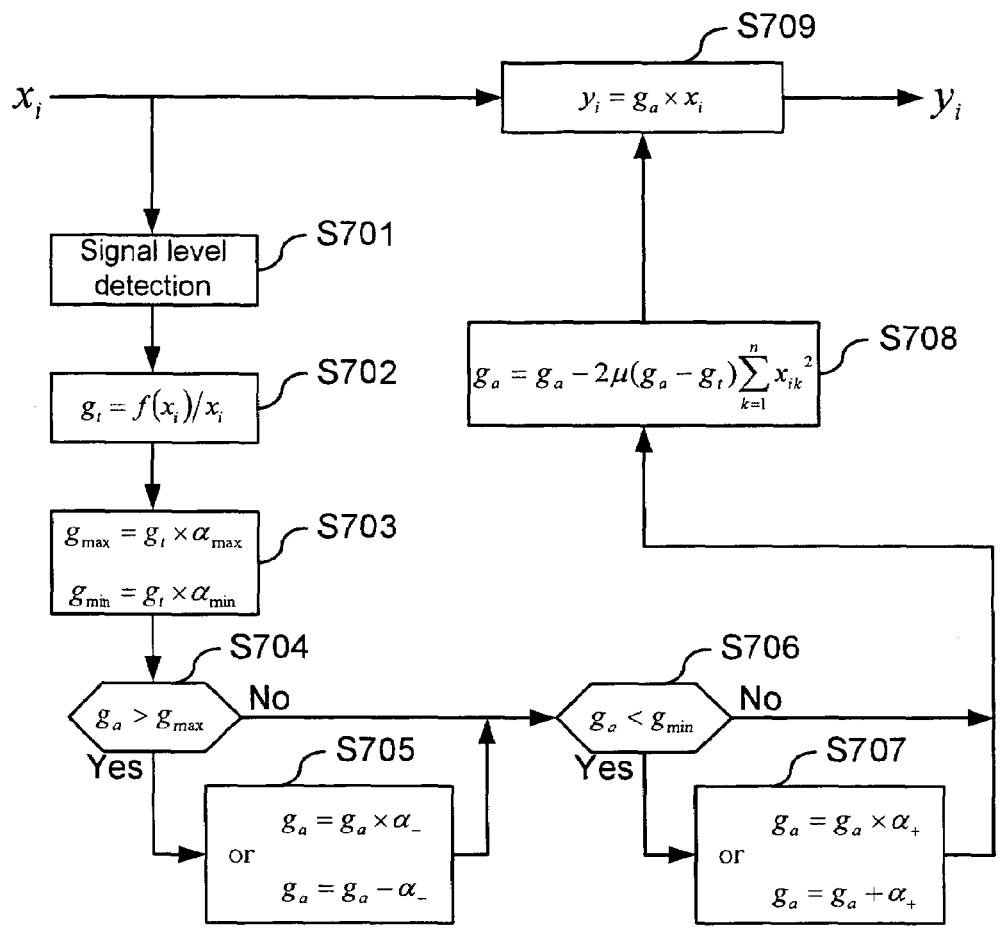
FIG. 7 is a flow chart illustrating another example of the process of updating the gain value $g_a$ by steps corresponding to the error between the gain value $g_a$ and the gain value $g_t$ and to a predetermined value.

FIG. 7 is a flow chart illustrating another example of the process of updating the gain value $g_a$ by steps corresponding to the error between the gain value $g_a$ and the gain value $g_t$ and to a predetermined value.

First, as in the process of FIG. 3, the gain calculator 12 detects the signal level of the input signal and obtains the gain value $g_t$ according to the signal level of the input signal (S701, S702).

Then, the gain updater 13 obtains a gain value $g_{max}$ and a gain value $g_{min}$ as in the process of FIG. 5 (S703). Subsequently, the gain updater 13 confirms whether the gain value $g_a$ is greater than the $g_{max}$ (S704). If the gain value $g_a$ is greater than the $g_{max}$ (S704: YES), the gain updater 13 decreases the $g_a$ by a step corresponding to $\alpha_-$ by multiplying the gain value $g_a$ by a predetermined value $\alpha_-$ ($\alpha_-<1$) or subtracting $\alpha_-$ from $g_a$ (S705). Also, the gain updater 13 confirms whether the gain value $g_a$ is less than the $g_{min}$ (S706). If the gain value $g_a$ is less than the $g_{min}$ (S706: YES), the gain updater 13 increases the $g_a$ by a step corresponding to $\alpha_+$ by multiplying the gain value $g_a$ by a predetermined value $\alpha+$ ($\alpha_+>1$) or adding $\alpha_+$ to $g_a$ (S707).

Further, the gain updater 13 updates the gain value $g_a$ according to the previous equation (2) regardless of the gain value $g_a$ (S708).

Then, the amplifier 11 amplifies the input signal with a gain of the updated gain value $g_a$ and outputs an amplified signal (S709).

That is, when the error between the gain value $g_a$ and the gain value $g_t$ is greater than a threshold value ($g_{max}-g_t$, or $g_t-g_{min}$), the gain value $g_a$ is updated stepwise so as to approach the gain value $g_t$ by steps corresponding to the predetermined values ($\alpha_+$, $\alpha_-$), and the updated gain value $g_a$ is updated stepwise so as to approach the gain value $g_t$ by steps corresponding to the error, by using the least-squares method. When the error between the gain value $g_a$ and the gain value $g_t$ is less than the threshold value, the gain value $g_a$ is updated stepwise so as to approach the gain value $g_t$, by using only the least-squares method.

Figure 8:
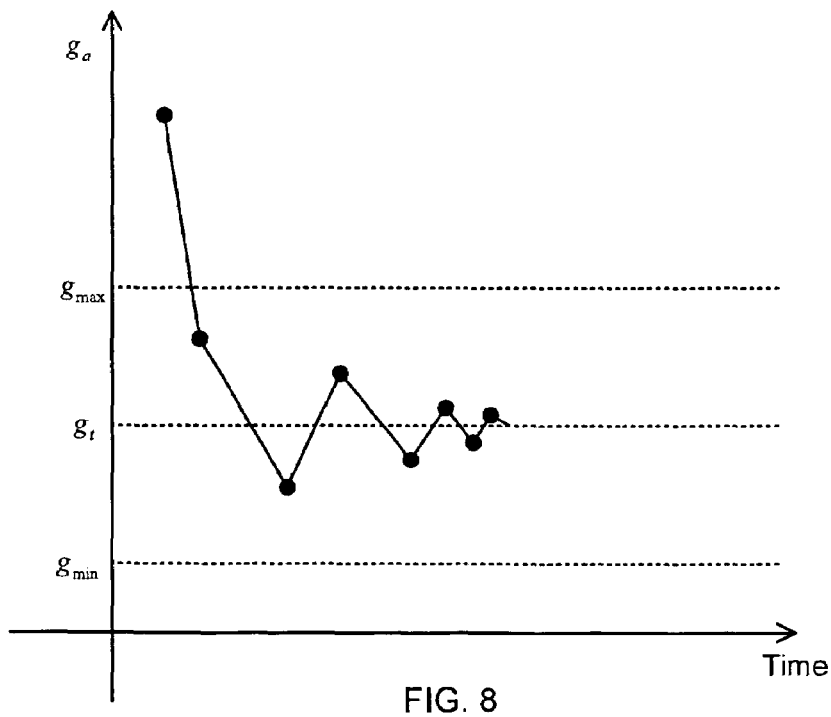
FIG. 8 is a graph showing an example of the transition of the gain value $g_a$ when the gain value $g_a$ is updated by the process of FIG. 7.

FIG. 8 is a graph showing an example of the transition of the gain value $g_a$ when the gain value $g_a$ is updated by the process of FIG. 7. As shown in the Figure, during the time that the gain value $g_a$ is outside the range of from $g_{max}$ to $g_{min}$, the gain value $g_a$ is updated by steps corresponding to the predetermined values, and further the updated gain value $g_a$ is updated so as to approach the gain value $g_t$ by steps corresponding to the error, by using the least-squares method. In contrast, during the time that the gain value $g_a$ is within the range of from $g_{max}$ to $g_{min}$, the gain value $g_a$ is updated so as to approach the gain value $g_t$, by using only the least-squares method.

Therefore, when the gain value $g_a$ is outside the range of from $g_{max}$ to $g_{min}$ the gain value $g_a$ is updated by steps corresponding to the predetermined values and further by steps corresponding to the error so as to approach the gain value $g_t$. Hence, the error can be decreased fast. After the error has become small, the gain value $g_a$ is updated by using only the least-squares method, and thus can be made to approach the target gain value $g_t$ without oscillating.

=Simulation Results=

Figure 9:
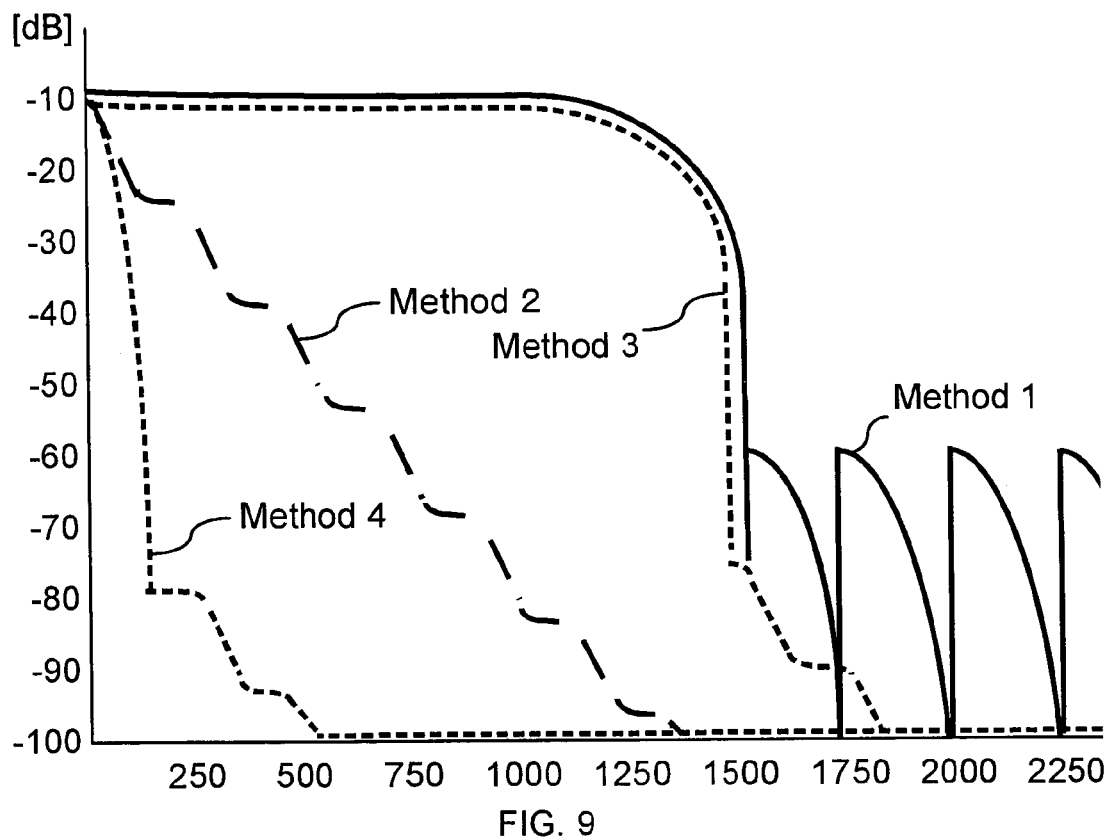
FIG. 9 is a graph showing results of simulating the transition of the error between the gain value $g_a$ and the gain value $g_t$ according to the methods of updating the gain value when the input signal is a sine wave.
Figure 10:
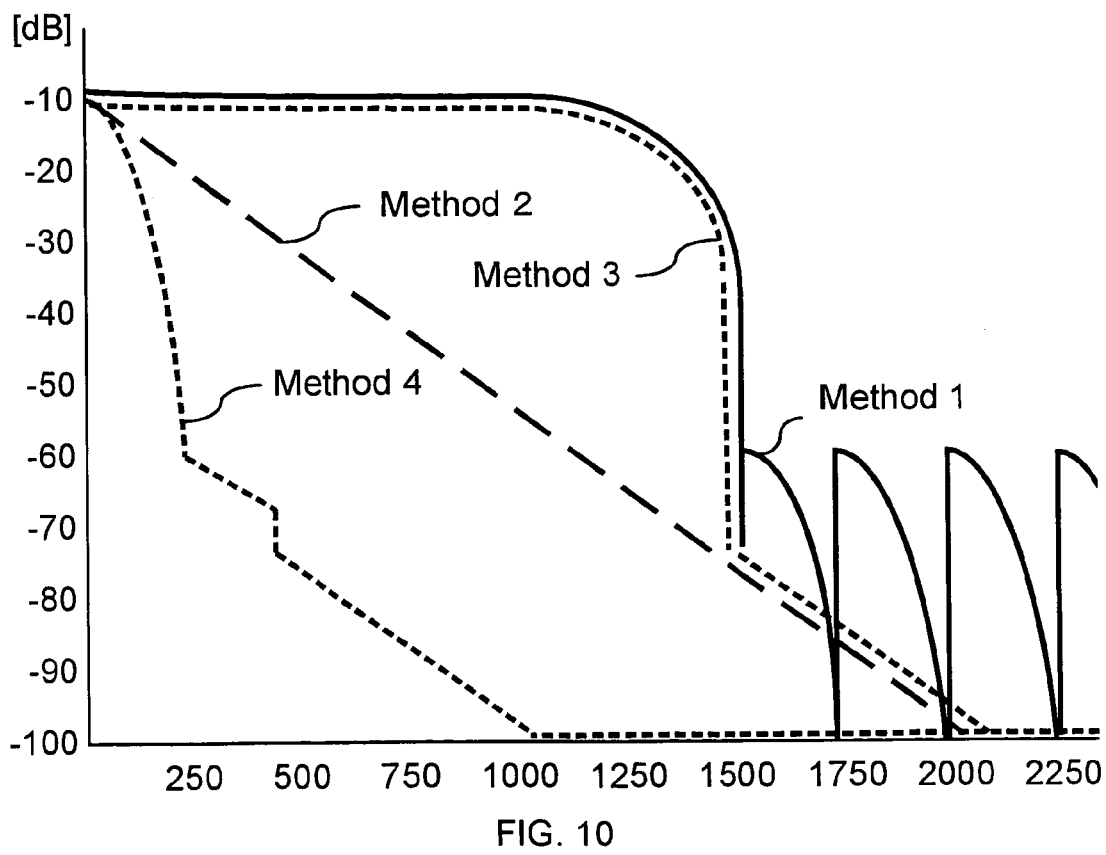
FIG. 10 is a graph showing results of simulating the transition of the error between the gain value $g_a$ and the gain value $g_t$ according to the methods of updating the gain value when the input signal is random noise.
Figure 11:
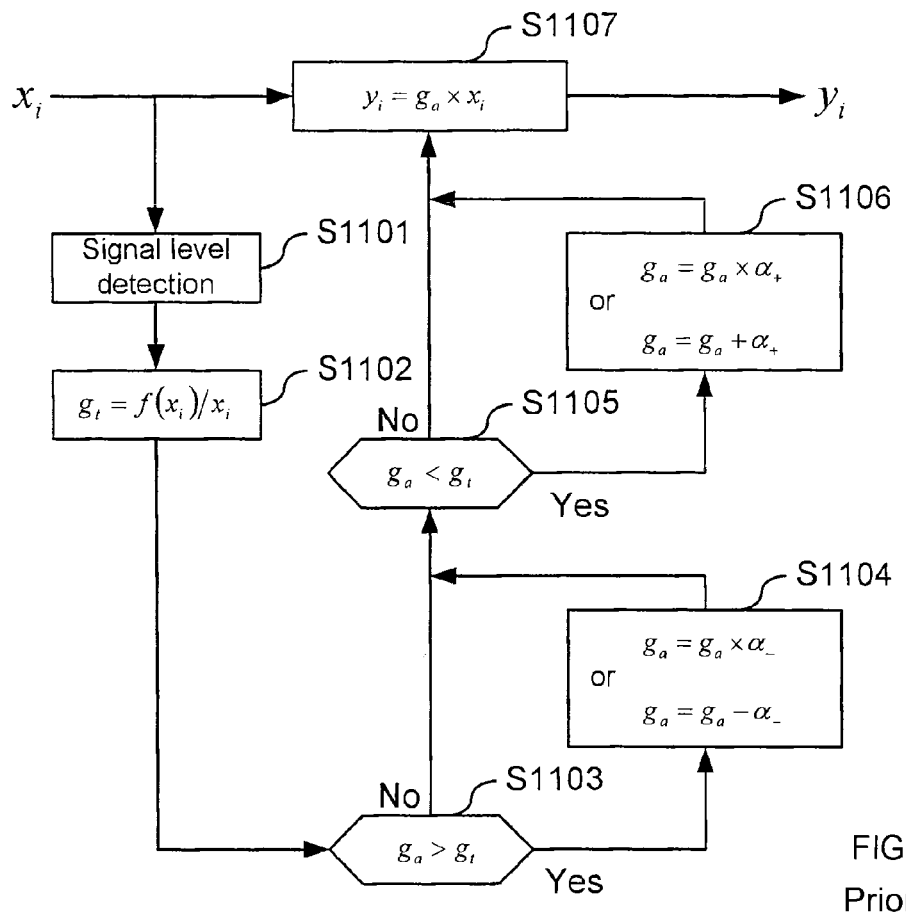
FIG. 11 is a flow chart illustrating an example of a conventional procedure with which the gain value is updated by steps corresponding to a predetermined value.
Figure 12:
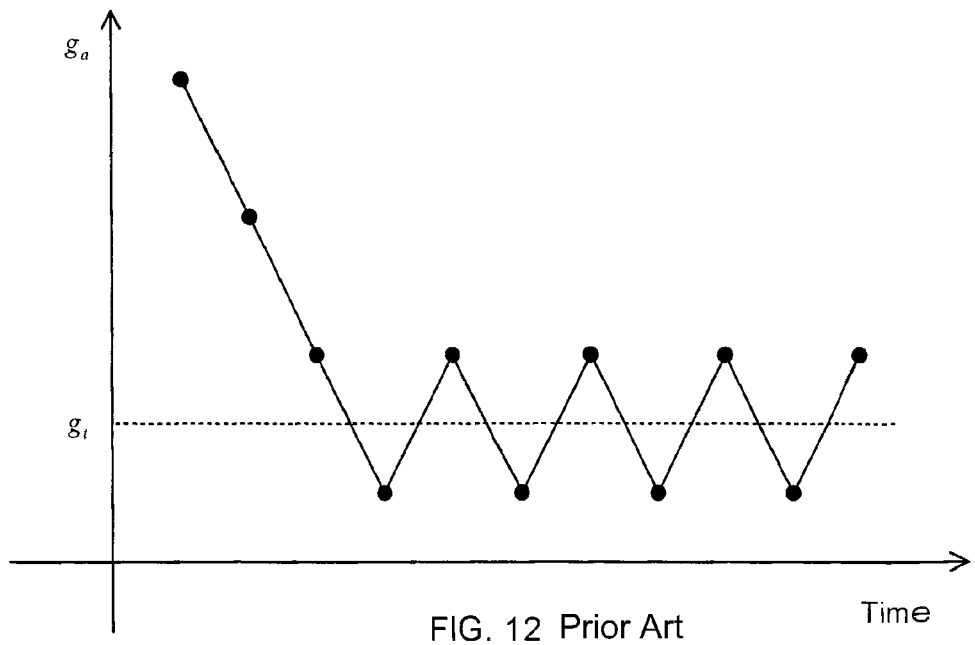
FIG. 12 is a graph showing an example of the transition of the gain value $g_a$ when the gain value $g_a$ is updated by the process of FIG. 11.

FIGS. 9 and 10 are graphs showing results of simulating the transition of the error between the gain value $g_a$ and the gain value $g_t$ according to the methods of updating the gain value. A method 1 is a conventional method shown in FIG. 11, and methods 2, 3, 4 are the methods according to the present invention shown in FIGS. 3, 5, 7 respectively. The abscissa of the graph represents the number of samplings, that is, the passage of time and the ordinate represents the error E between the gain value $g_a$ and the gain value $g_t$ given by the equation (3):

$$E = 20.0 \times \log_{10}(|g_t - g_a|) \quad (3)$$

It is assumed that updating the gain value $g_a$ by steps corresponding to the predetermined values ($\alpha_+$, $\alpha_-$) is performed by adding and subtracting the predetermined values to and from the gain value $g_a$. Let $\alpha_+ = \alpha_- = 1/128$ and $\mu$ of equation (2)=1/16. Further, it is assumed that the input signal in FIG. 9 is a sine wave having a maximum signal level of 1 and that the input signal in FIG. 10 is random noise having a maximum signal level of 1.

And it is assumed that the threshold values for the methods 3, 4 are −20 dB. That is, in the method 3, if the error E is greater than −20 dB, the gain value $g_a$ is updated by steps corresponding to the predetermined values, and if the error E is less than −20 dB, the gain value $g_a$ is updated by steps corresponding to the error. In contrast, in the method 4, if the error E is greater than −20 dB, the gain value $g_a$ is updated by steps corresponding to the predetermined values and further by steps corresponding to the error. Note that in the graphs of FIGS. 9 and 10, the error E equals −100 dB when $|g_t - g_a|$ is at zero.

As shown in FIGS. 9 and 10, with the conventional method 1, the error oscillates without converging on a zero. On the other hand, it can be seen that with the method 2, the error converges faster without oscillating than with the method 1. Also, it can be seen that with the method 3, the error converges on a zero without oscillating. Moreover, it can be seen that with the method 4, the error converges faster without oscillating than with the method 2. Note that in the method 3, by setting the predetermined values ($\alpha_+$, $\alpha_-$) greater than 1/128, the error can be made to converge faster than in FIGS. 9, 10.

The signal level adjusting apparatus 1 according to an embodiment of the present invention has been described above. As described above, the signal level adjusting apparatus 1 can update the gain value $g_a$ stepwise so as to approach the $g_t$ by steps corresponding to the error between the gain value $g_a$ and the gain value $g_t$. By this means, the gain value $g_a$ can be made to approach the gain value $g_t$ without oscillating. Also in this case, when the error is large, the steps by which to update the gain value $g_a$ become large, and thus the convergence of the gain value $g_a$ can be speeded up.

Alternatively, when the error is greater than a predetermined threshold value, the signal level adjusting apparatus 1 can update the gain value $g_a$ stepwise so as to approach the gain value $g_t$ by steps corresponding to the predetermined values ($\alpha_+$, $\alpha_-$), and when the error becomes less than the predetermined threshold value, update the gain value $g_a$ by steps corresponding to the error. By this means, the gain value $g_a$ can be made to approach the gain value $g_t$ without oscillating. Also in this case, by increasing the steps corresponding to the predetermined values, the convergence of the gain value $g_a$ can be speeded up.

Alternatively, when the error is greater than a predetermined threshold value, the signal level adjusting apparatus 1 can update the gain value $g_a$ stepwise so as to approach the gain value $g_t$ by steps corresponding to the predetermined values ($\alpha_+$, $\alpha_-$) and further by steps corresponding to the error, and when the error becomes less than the predetermined threshold value, update the gain value $g_a$ by only steps corresponding to the error. By this means, the gain value $g_a$ can be made to approach the gain value $g_t$ without oscillating. Also in this case, when the error is greater than the predetermined threshold value, the gain value $g_a$ is updated by steps corresponding to the predetermined values and further by steps corresponding to the error, and thus the convergence of the gain value $g_a$ can be further speeded up.

The signal level adjusting apparatus 1 may determine the predetermined threshold values with which to compare the error from the $g_{max}$ and $g_{min}$. That is, the predetermined threshold values can be obtained based on the gain value $g_t$. Hence, the predetermined threshold values can be set appropriately according to the target gain value $g_t$.

Furthermore, the signal level adjusting apparatus 1 can obtain steps corresponding to the error by using the least-squares method. By this means, the gain value $g_a$ can be updated such that the error approaches a zero.

Although the preferred embodiment of the present invention has been described, the above embodiment is provided to facilitate the understanding of the present invention and not intended to limit the present invention. It should be understood that various changes and alterations can be made therein without departing from spirit and scope of the invention and that the present invention includes its equivalents.

For example, although in the present embodiment the steps corresponding to the error are obtained by using the least-squares method, not being limited to this, the method of obtaining steps corresponding to the error may be to use a general adaptive filter including a recursive type.

What is claimed is:

1. A signal level adjusting apparatus comprising:
an amplifier that amplifies an input signal with a gain of a first gain value and outputs an amplified signal;
a gain calculator that obtains a second gain value according to a signal level of the input signal; and
a gain updater that updates the first gain value stepwise such that the first gain value approaches the second gain value by steps corresponding to an error between the first gain value and the second gain value,
wherein the gain updater obtains the steps corresponding to the error by using a least-squares method so that the error approaches a zero.

2. A signal level adjusting apparatus comprising:
an amplifier that amplifies an input signal with a gain of a first gain value and outputs an amplified signal;
a gain calculator that obtains a second gain value according to a signal level of the input signal; and
a gain updater that, when an error between the first gain value and the second gain value is greater than a predetermined threshold value, updates the first gain value stepwise such that the first gain value approaches the second gain value by steps corresponding to a predetermined value and, when the error is less than the threshold value, updates the first gain value stepwise such that the first gain value approaches the second gain value by steps corresponding to the error.

3. The signal level adjusting apparatus according to claim 2, wherein the gain updater obtains the steps corresponding to the error by using a least-squares method so that the error approaches a zero.

4. The signal level adjusting apparatus according to claim 2, wherein the gain updater obtains the threshold value based on the second gain value.

5. A signal level adjusting apparatus comprising:
an amplifier that amplifies an input signal with a gain of a first gain value and outputs an amplified signal;
a gain calculator that obtains a second gain value according to a signal level of the input signal; and
a gain updater that, when an error between the first gain value and the second gain value is greater than a predetermined threshold value, updates the first gain value stepwise such that the first gain value approaches the second gain value by steps corresponding to a predetermined value and to the error and, when the error is less than the threshold value, updates the first gain value stepwise such that the first gain value approaches the second gain value by steps corresponding to the error.

6. The signal level adjusting apparatus according to claim 5, wherein the gain updater obtains the steps corresponding to the error by using a least-squares method so that the error approaches a zero.

7. The signal level adjusting apparatus according to claim 5, wherein the gain updater obtains the threshold value based on the second gain value.

8. A method of updating a first gain value for a signal level adjusting apparatus which amplifies an input signal with a gain of the first gain value and outputs an amplified signal, the method comprising:
   obtaining a second gain value according to a signal level of the input signal; and
   updating the first gain value stepwise such that the first gain value approaches the second gain value by steps corresponding to an error between the first gain value and the second gain value,
   wherein when updating the first gain value stepwise, the steps corresponding to the error are obtained by using a least-squares method so that the error approaches a zero.

9. A method of updating a first gain value for a signal level adjusting apparatus which amplifies an input signal with a gain of the first gain value and outputs an amplified, the method comprising:
   obtaining a second gain value according to a signal level of the input signal; and
   when an error between the first gain value and the second gain value is greater than a predetermined threshold value, updating the first gain value stepwise such that the first gain value approaches the second gain value by steps corresponding to a predetermined value and, when the error is less than the threshold value, updating the first gain value stepwise such that the first gain value approaches the second gain value by steps corresponding to the error.

10. The method of updating a gain value according to claim 9, wherein when updating the first gain value stepwise, the steps corresponding to the error are obtained by using a least-squares method so that the error approaches a zero.

11. A method of updating a first gain value for a signal level adjusting apparatus which amplifies an input signal with a gain of the first gain value and outputs an amplified signal, the method comprising:
   obtaining a second gain value according to a signal level of the input signal; and
   when an error between the first gain value and the second gain value is greater than a predetermined threshold value, updating the first gain value stepwise such that the first gain value approaches the second gain value by steps corresponding to a predetermined value and to the error and, when the error is less than the threshold value, updating the first gain value stepwise such that the first gain value approaches the second gain value by steps corresponding to the error.

12. The method of updating a gain value according to claim 11, wherein when updating the first gain value by the steps corresponding to the predetermined value and to the error and when updating the first gain value by the steps corresponding to the error, the steps corresponding to the error are obtained by using a least-squares method so that the error approaches a zero.

13. A computer-readable medium containing a computer software program that makes a signal level adjusting apparatus amplifying an input signal with a gain of the first gain value and outputting an amplified signal execute:
   a procedure of obtaining a second gain value according to a signal level of the input signal; and
   a procedure of updating the first gain value stepwise such that the first gain value approaches the second gain value by steps corresponding to an error between the first gain value and the second gain value,
   wherein the procedure of updating the first gain value stepwise includes obtaining the steps corresponding to the error by using a least-squares method so that the error approaches a zero.

14. A computer-readable medium containing a computer software program that makes a signal level adjusting apparatus amplifying an input signal with a gain of the first gain value and outputting an amplified signal execute:
   a procedure of obtaining a second gain value according to a signal level of the input signal;
   a procedure of, when an error between the first gain value and the second gain value is greater than a predetermined threshold value, updating the first gain value stepwise such that the first gain value approaches the second gain value by steps corresponding to a predetermined value; and
   a procedure of, when the error is less than the threshold value, updating the first gain value stepwise such that the first gain value approaches the second gain value by steps corresponding to the error.

15. The computer-readable medium containing a computer software program according to claim 14, wherein the procedure of updating the first gain value stepwise includes obtaining the steps corresponding to the error by using a least-squares method so that the error approaches a zero.

16. A computer-readable medium containing a computer software program that makes a signal level adjusting apparatus amplifying an input signal with a gain of the first gain value and outputting an amplified signal execute:
   a procedure of obtaining a second gain value according to a signal level of the input signal;
   a procedure of, when an error between the first gain value and the second gain value is greater than a predetermined threshold value, updating the first gain value stepwise such that the first gain value approaches the second gain value by steps corresponding to a predetermined value and to the error; and
   a procedure of, when the error is less than the threshold value, updating the first gain value stepwise such that the first gain value approaches the second gain value by steps corresponding to the error.

17. The computer-readable medium containing a computer software program according to claim 16, wherein the procedure of updating the first gain value by the steps corresponding to the predetermined value and to the error and the procedure of updating the first gain value by the steps corresponding to the error each include obtaining the steps corresponding to the error by using a least-squares method so that the error approaches a zero.

* * * * *